United States Patent [19]

Hirano et al.

[11] Patent Number: 4,784,717

[45] Date of Patent: Nov. 15, 1988

[54] METHOD OF MANUFACTURING BAPB1-XBIX03 SINGLE CRYSTAL

[76] Inventors: Shinichi Hirano, 123 Meidai Yadacho Syukusya, 66, Yadacho 2-chome, Nagoya; Ryo Toyokuni; Hiroshi Kuroda, both of 31-1, Kameido 6-chome, Koto-ku, Tokyo, all of Japan

[21] Appl. No.: 33,454

[22] Filed: Apr. 1, 1987

[30] Foreign Application Priority Data

Apr. 3, 1986 [JP] Japan ............................ 61-77347

[51] Int. Cl.$^4$ .............................................. C30B 7/10
[52] U.S. Cl. ................................. 156/623 R; 156/621; 156/DIG. 70; 156/DIG. 79; 156/DIG. 85; 252/518; 252/521; 423/593
[58] Field of Search ............ 423/593; 156/621, 623 R, 156/DIG. 70, DIG. 79, DIG. 85; 252/518, 521, 62.3 V, 62.3 BT

[56] References Cited

U.S. PATENT DOCUMENTS 3,932,315 1/1976 Sleight ............................ 252/518
4,579,622 4/1986 Caporaso et al. ............... 156/623 R

FOREIGN PATENT DOCUMENTS 0199440 10/1986 European Pat. Off. ............ 156/621
60-145997 8/1985 Japan ................................ 156/621

OTHER PUBLICATIONS

Katsui et al., Single Crystal Growth of Ba(Pb,Bi)O, From Molten KCl Solvent, Japanese Journal of Applied Physics, vol. 21, No. 3 (Mar. 82), 157–158.
Katsui, Single Crystal Growth of Superconducting $BaPb_{1-x}Bi_xO_3$, Japanese Journal of Applied Physics vol. 21, No. 9, Sep. 1982, pp. 553–554.
2300 Journal of Crystal Growth 66(1984) Jan.–Feb., No. 1, Amsterdam, Netherlands–Article Entitled Growth of Superconducting Ba(Pb,Bi)O$_3$ Crystals.

Primary Examiner—John Doll
Assistant Examiner—Robert M. Kunemund
Attorney, Agent, or Firm—Bruce L. Adams; Van C. Wilks

[57] ABSTRACT

A method of manufacturing $BaPb_{1-x}Bi_xO_3$ single crystal wherein the $BaPb_{1-x}Bi_xO_3$ single crystal is grown by hydrothermal synthesis which applies heat and pressure to a nutrient composed of $BaPb_{1-x}Bi_xO_3$ within a nitrate aqueous solution, such as $LiNO_3$, $KNO_3$ and $NaNO_3$ aqueous solutions.

23 Claims, 4 Drawing Sheets

VARIATION OF CUBIC IMITATED LATTICE CONSTANTS a AGAINST COMPOSITION X

METHOD OF MANUFACTURING BAPB₁

BACKGROUND OF THE INVENTION

The present invention relates to methods of manufacturing single crystal which is widely used as a superconducting element, a semiconducting element or an optoelectronic element in the electronics industry and the like.

$BaPb_{1-x}Bi_xO_3$ (barium-lead-bismuth oxide) having Pervoskite structure, shows superconductivity in the range of $0.05 > x \leq 0.30$, semi-metallic characteristics in the range of $x < 0.05$, and semi-conductivity in the range of $0.30 < x$. The maximum super-conductive transition temperature Tc a 13K when X is approximately 0.25. This is the highest known temperature at which an oxide material that does not include transition metal elements exhibits the super-conductivity. Attention has focussed on these barium-lead-bismuth oxide compounds because of their super-conductivity and because the superconductivity depends on their exact composition. Further, the compounds of this series include semi-metallic materials and its carrier density N(O) at Fermi surface is extraordinarily small as a super-conductor. Therefore, these compounds have a resistance rate that is several orders of magnitude greater than ordinary metal super-conductors, at temperatures slightly higher than Tc. This characteristic is required for materials used for superconductive switches. When barium-lead-bismuth oxide compounds are formed as single crystals, they are relatively stable and crystals which are transparent in the infra-red region, can be expected to be useful for optical electronics elements at very low temperatures.

Conventionally, the growth of $BaPb_{1-x}Bi_xO_3$ single crystal is carried out by the crystallization utilizing a flux. According to one method, KCl can be utilized as the main conponent of the flux. KCl flux is favorable as a flux to dissolve $BaPb_{1-x}Bi_xO_3$, but to dissolve KCl and to melt KCl in $BaPb_{1-x}Bi_xO_3$, a high temperature of about 1000° C. is necessary, and thus potassium ion remains within $BaPb_{1-x}Bi_xO_3$ single crystal, and thus the impurity density becomes large. Also, as the material grows at a temperature higher than the transition point of $BaPb_{1-x}Bi_xO_3$, the point existing in a range from 500° C. to 600° C., crystal phase transition occurs during cooling down, and therefore, a strain largely occurs within the crystal.

There is another method utilizing $PbO_2$—$Bi_2O_3$—$BaPbO_3$ solution which is a non-stoichiometric compound solution. In this case, there is an advantage that the enclosure of the impurity material will lessen greatly, but, when crystallizing $BaPb_{1-x}Bi_xO_3$ from the non-stoichiometric compound, control of the composition factor x that determines the characteristics of the material, is very difficult. Also, a strain accompanying as phase transition, occurs the stated above.

Technology of the above prior art is disclosed in the following document, Akinori Katsui; Japanese Journal of Applied Physics Vol. 21 No. 9 (1982) Pages 553 to 554.

In accordance with the conventional method of manufacturing $BaPb_{1-x}Bi_xO_3$ single crystal, the impurity density within the material is large, and also, the change of composition factor x in the material is great. Also the conventional method has various problems, such as the reappearance characteristic of composition x is bad, and the phase transition occurs, and the heat strain remains because of the high temperature growth process at about 1000° C., and these problems are the major factors that prevent the sharp transition to the super-conductivity of the material.

The inventors have invented and filed the related application Ser. No. 837,515) with respect to a method of manufacturing $BaPb_{1-x}Bi_xO_3$ single crystal grown by hydrothermal synthesis using a chloride aqueous solution.

SUMMARY OF THE INVENTION

The problems of the prior art such as the impurity, the change of composition factor x and the inner strain, are caused by crystallizing $BaPb_{1-x}Bi_xO_3$ from the solution has high viscosity and large composition change, at a very high temperature. Therefore, to solve these problems, the present invention has been devised.

An object of the present invention is to provide a method to manufacture $BaPb_{1-x}Bi_xO_3$ single crystal by hydrothermal synthesis, which enables the crystal to grow at a low temperature below 500° C. where it is possible to improve the completion characteristic of the crystal avoiding its phase transition.

BRIEF DESCRIPTION OF THE INVENTION

DETAILED DESCRIPTION OF THE INVENTION

In the hydrothermal synthesis, the starting material is dissolved in a solution of an appropriate solvent at an appropriate temperature and pressure, and the intended crystal is crystallized or is grown on a suitable substrate. The growth temperature is generally from 300° C. to 600° C., and this temperature is very low as compared to the prior art method. By selecting and arranging the temperature, pressure, the kind of solvent, the controlling method of the starting material and the substrate on which the crystal is to grow, a single crystal with very little defects can be grown.

A more detailed explanation referring to several examples follows;

EXAMPLE 1

Figure 2:
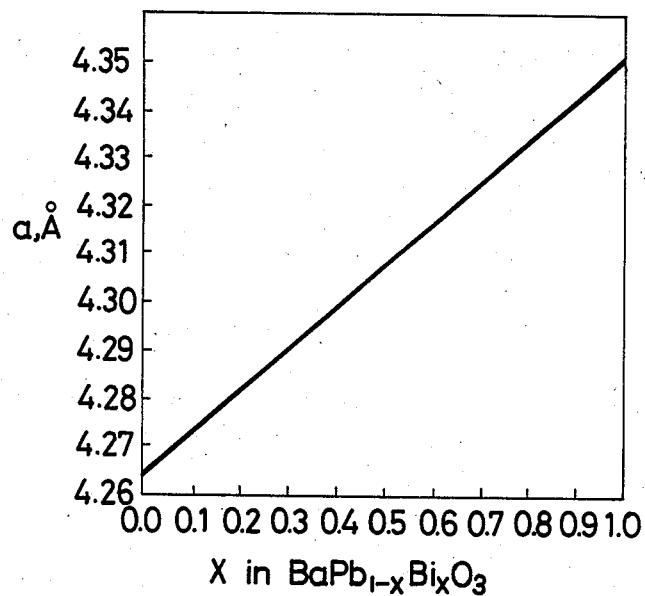
FIG. 2 is a characteristic diagram showing the variation of cubic imitated lattice constant a corresponding to composition factor x.

By utilizing available high purity reagents $BaCo_3$, $PbO_2$, $Bi_2O_3$ as the starting material, and by conducting adjustments so that the super-conductive composition factors $x=0.2$, $x=0.3$ are achieved within $BaPb_{1-x}Bi_xO_3$ single crystals respectively, the compounds are blended in a mortar and baked for one whole day at 850° C. in flow of oxygen gas. To conduct the reaction completely, the above process is repeated once again. When the above adjusted powder samples are examined by an X-ray diffractometer, the respective samples are proved to have $BaPb_{1-x}Bi_xO_3$ single phase. From the above measurement, there is the relation between lattice constant ā (cubic imitated lattice constant) and composition factor x, as shown in FIG. 2. Referring to FIG. 2, the composition factor x corresponding to ā are, respectively, x=0.21 and x=0.27.

Figure 3:
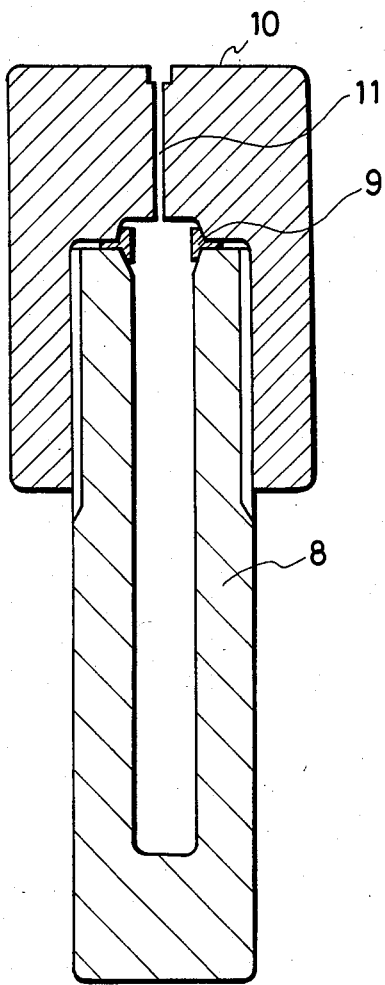
FIG. 3 is a sectional diagram showing the structure of the test tube.

For the hydrothermal process, a test tube type autoclave with the material of stelite 25 was utilized. FIG. 3 is the sectional diagram showing the structure of the autoclave. The autoclave 8 is pressure-sealed by a cover 10, through a sealing ring 9. The measurement of the inner temperature of the autoclave was conducted through a temperature measuring hole 11. As the test tube of the above described structure, a gold capsule of a diameter 3 mm or a diameter 5 mm was utilized the above adjusted sample and solvent were poured into the gold capsule, and the hydrothermal synthesis was carried out. In this case distilled water was filled up inside the autoclave, to keep the pressure balance between the inner and the outer sides of the gold capsule.

As the solvents, 3 mol $NaNO_3$ aqueous solution, 3 mol $KNO_3$ aqueous solution, and 3 mol $LiNO_3$ aqueous solution was utilized, and the hydrothermal process was conducted for 7 days at a pressure 1000 kg/cm$^2$, and at a process temperature 410° to 450° C. The result is shown in Table 1 where o indicates that crystallization occurs.

TABLE 1

| Sample No. | Density and the type of solvents | Whether the crystallization occurs or not |
|---|---|---|
| 1 | 3 mol $NaNO_3$ aqueous solution | o |
| 2 | 3 mol $KNO_3$ aqueous solution | o |
| 3 | 3 mol $LiNO_3$ aqueous solution | o | temperature 410° to 450° C.
pressure 1000 kg/cm$^2$
growth period 7 days

It was observed that, with any of the above solvents, the samples were dissolved into and re-precipirated from the solution, and crystals were grown. The same result was obtained with the respective samples of composition factor x=0.21, x=0.27. When each of the obtained crystals was powdered and examined by an X-ray diffractometer, it was observed that all of them are of $BaPb_{1-x}Bi_xO_3$ single phase. With respect to the solvents, the crystal with best crystallization characteristic and growth speed was obtained from the solvent of $NaNO_3$ or $KNO_3$ aqueous solution.

EXAMPLE 2

By utilizing 3 mol $NaNO_3$ aqueous solution as the solvent, the same process was conducted as in Example 1, but at the process temperature at 300° to 450° C.

Table 2 shows the result where X indicates that crystallization does not occur, and O indicates that crystallization occurs.

TABLE 2

| | Temperature of the gold capsule Temperature of | | Whether the crystallization occurs or not |
|---|---|---|---|
| Sample No. | the upper part | the lower part | |
| 4 | 320° C. | 350° C. | X |
| 5 | 360° C. | 400° C. | O |
| 6 | 410° C. | 450° C. | O | solvent 3 mol $NaNO_3$ aqueous solution
pressure 1000 kg/cm$^2$
growth period 7 days When the process temperature was 350° C., neither dissolvement nor re-crystallization was observed, and the sample remained in the lower part of the gold capsule, but when the process temperature was above 400° C., the sample was dissolved and re-crystallized, and the crystal was grown in a size of about 2 mm diameter. The same result can be obtained with samples having composition factor x=0.21, or x=0.27. When the process temperature was 450° C., a larger crystal was obtained as compared to the case when the process temperature was 400° C., but a twin crystal was generated sometimes, the surface was coarse and many secondary grains were attached onto the crystal. These defects are thought to occur because secondary nucleation generates when cooling down the crystal during which the obtained crystal is powdered and examined by an X-ray diffractometer. It was observed that the crystals were all $BaPb_{1-x}Bi_xO_3$ single phase. Its composition factor was measured as shown in Table 3 in accordance with the same relation as shown in FIG. 2.

TABLE 3

| Composition factor x of starting sample | Composition factor x of the crystal after the hydrothermal synthesis |
|---|---|
| 0.21 | 0.20 |
| 0.27 | 0.25 | the factor x depends on $BaPb_{1-x}Bi_xO_3$.

Therefore, x=0.21 was changed to x=0.20, and x=0.27 was changed to x=0.25, but the composition gap difference between the starting sample and the synthesized crystal was minute.

Moreover, the inventors examined the relation between composition factor x of the nutrient and the composition factor x of grown crystal. When the composition factor x of nutrient was equal to 0.1 or 0.3, the composition factor x of grown crystal was 0.095 or 0.29, respectively. As described above, in the case of using a nitrate aqueous solution as a solvent $BaPb_{1-x}Bi_xO_3$ single crystals of the intended composition x are easily obtained with suitable adjustment to the nutrient.

EXAMPLE 3

Figure 1:
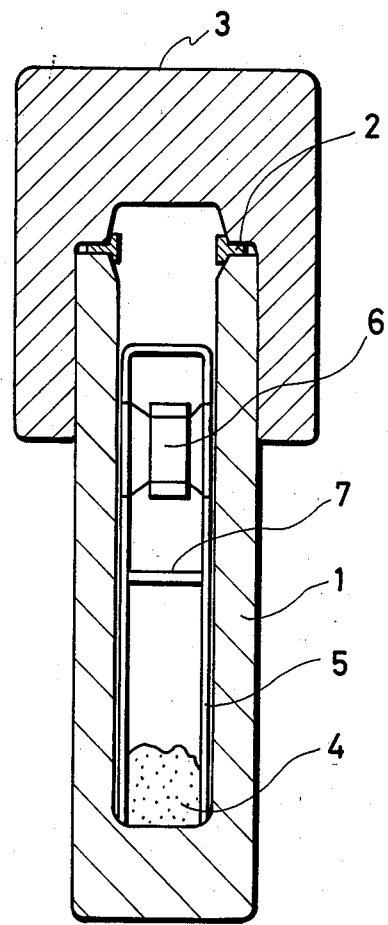
FIG. 1 is the sectional diagram showing the structure of an autoclave.

FIG. 1 is a sectional diagram showing the structure of an autoclave. The autoclave is similar to the test tube of stelite 25 as in Example 1, but platinum plate inner lining is provided inside to avoid the pollution by impurities. The autoclave 1 is pressure-sealed with a cover 3, through a seal ring 2. In the above structured test tube, nutrient 4 was provided at the bottom of the autoclave. This nutrient 4 was obtained by grinding and powdering $BaPb_{1-x}Bi_xO_3$ which was obtained by the method of Example 2, the crystal having either x=0.20 or x=0.25. Then substrate 6 was mounted on the upper part of the autoclave above the nutrient 4, through a substrate support frame 5. For the material of the substrate 6, a crystal of $SrTiO_3$ having a crystal surface (001) which has similar crystal structure and similar atom bond length was utilized, but, the crystal surface is not limited just to (001) surface, but (111) surface and (110) surface are also utilizable. The nutrient 4 and the substrate 6 were thus mounted in the autoclave and a buffer plate 7 was disposed therebetween through the substrate support frame 5. Inside the autoclave of the above structure, 3 mol $NaNO_3$ aqueous solution was charged as a solvent so that the filling rate at a determined temperature and determined pressure was obtained. In this state, the hydrothermal process in the same condition as of Table 2 of Example 2 was carried out. This condition was:
  temperature of substrate 6=360° C.
  temperature of nutrient 4=400° C.
  pressure=1000 kg/cm$^2$
  growth period=7 days.

After the hydrothermal process, the autoclave was subjected to sudden cooling, to prevent the generation of secondary nucleation while cooling down.

As a result, a thin film with uniform thickness was formed on the substrate 6. When X-ray diffractometer was used to examine this thin film as in Example 1, the thin film was identified to be $BaPb_{1-x}Bi_xO_3$ single crystal. Referring to x, as x=0.20, x=0.24 respectively, no big change was observed as compared to the nutrient. When the super-conductive characteristic of the $BaPb_{1-x}Bi_xO_3$ thin film at x=0.24, was measured, the thin film was confirmed that it showed super-conductivity transition at a range of 10.0K to 11.7K. The superconducting characteristic is shown in FIG. 4.

Figure 4:
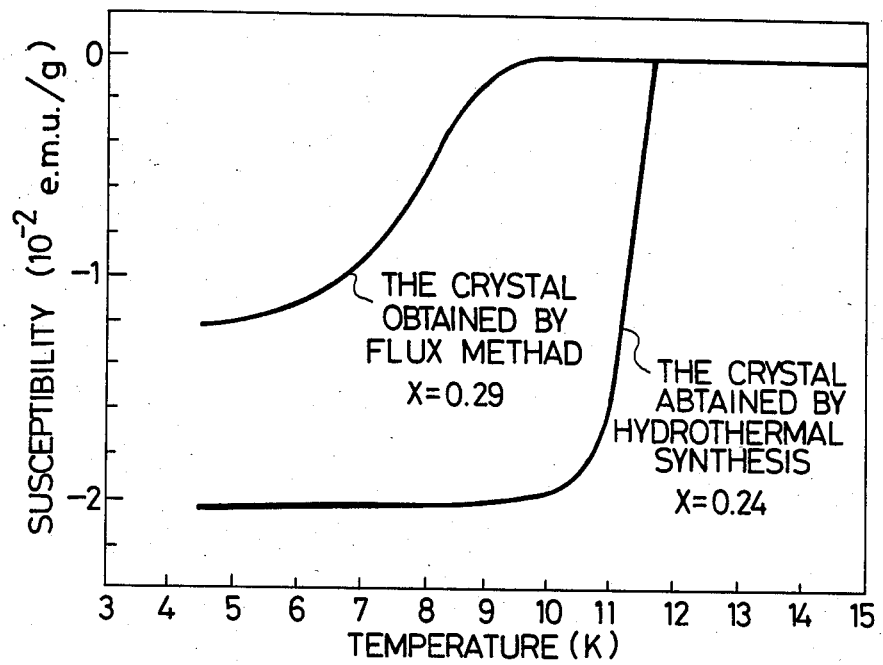
FIG. 4 is a graph showing the super-conducting characteristics.

In the super-conducting characteristic curve of FIG. 4, the temperature (K.) is plotted on the abscissa and the susceptibility ($10^{-2}$ e.m.u./g) as the superconducting characteristic is plotted on the ordinate. From FIG. 4, it may be understood that the crystal (x=0.24) obtained by the hydrothermal synthesis of Example 3 of the present invention is highly improved in the super-conducting characteristics over the crystal (x=0.29) obtained according to the conventional flux method.

EXAMPLE 4

The hydrothermal process of Example 4 is the same as Example 3 shown in FIG. 1, but the solvent is different.

The conditions are as follows;
  temperature of substrate, 6=360° C. temperature of nutrient 4=400° C. solvent=aqueous solution which is 3 mol $NaNO_3$ aqueous solution to which 2% of the total weight of 2.0 mol $KClO_3$ aqueous solution is added. pressure=1000 kg/cm$^2$ growth period=7 days.

As in Example 3, quenching was carried out after the hydrothermal process. In this case, the thin film was also formed on the surface of $SrTiO_3$ crystal (001). This thin film was confirmed with X-ray to be $BaPb_{1-x}Bi_xO_3$ thin film, and its super-conductivity was similarly observed at a range of 10.0K to 11.7K of super-conductive transition temperature, but as compared to Example 3, improved was more clear and its super-conductivity.

This is because a necessary amount of peroxide such as NaClO was added to the solution, and this generates an active atmosphere of oxygen. By utilizing this generate oxygen, oxygen defficiency inside the crystal is prevented, and atom valence in the crystal is automatically controlled, and thus the movement characteristic or super-conductivity of the crystal is improved. Also in the case of $NaClO_3$, after the dissolution, $NaClO_3$ becomes NaCl in the aqueous solution, and there is an advantage that NaCl does not become a factor of impurities in the crystals. $NaClO_3$ is not the only compound utilizable in this case, but peroxide such as sodium perchlorate $NaClO_4$ can be utilized, where the level of reaction, or adding amount is appropriately selectable.

As stated above, and as is compared to the conventional flux method utilizing KCl flux or the crystallization method from the non-stoichiometric solution, in accordance with the present invention there are several beneficial effects. For example, the potassium ions are hardly kept in the crystal as impurities, because this inventive method is a process utilizing low-viscosity KCl aqueous solution at a low temperature of 400° to 450° C. Also, as the appearance of phenomenon of super-conductivity of $BaPb_{1-x}Bi_xO_3$ crystal is important, from the point that reappearance of the composition factor x is very efficient, this invention has a remarkable industrial advantage that the single crystal of a desired composition factor x is easily manufactured with the adjustment of the starting materials. Similarly, since the process is carried out at a low temperature of about 400° C., defects such as heat strain accompanying the phase transition is very small. Therefore, a more perfect crystal can be obtained, and at the same time, by adding such compounds as peroxide into solvents, the oxygen defficiency is lessened and the atom valence is controlled, and so it is possible to improve the crystal perfection.

In accordance with the inventive method, by obtaining a complete crystal with uniform composition factor x, the improvement of super-conductivity is achieved, and its effect is very remarkable.

Also, because the process temperature is approximately 400° C., it is very easy to conduct hydrothermal growth of the artificial crystals in an industrial scale using existing equipment and apparatus.

As described above, in accordance with the present invention, $BaPb_{1-x}O_3$ crystal valuable as super-conductive elements or an optical electronics element, and having more perfect characteristics with little defects can be obtained, and because this invention can offer a new manufacturing method with new industrial possibilities, its effect is very significant.

We claim:

1. A method of manufacturing $BaPb_{1-x}Bi_xO_3$ single crystal wherein the $BaPb_{1-x}Bi_xO_3$ single crystal is grown by hydrothermal synthesis which applies heat and pressure to a nutrient composed of $BaPb_{1-x}Bi_xO_3$ within an aqueous solution containing a nitrate as the main component at a temperature and pressure effective to grow the $BaPb_{1-x}Bi_xO_3$ single crystal.

2. The method according to claim 1; wherein the hydrothermal synthesis is carried out at a temperature above 350° C.

3. The method according to claim 1; wherein said nitrate comprises $LINO_3$.

4. The method according to claim 1; wherein said nitrate comprises $KNO_3$.

5. The method according to claim 1; wherein said nitrate comprises $NaNO_3$.

6. The method according to claim 1; wherein said hydrothermal synthesis is carried out in a pressure vessel and the $BaPb_{1-x}Bi_xO_3$ single crystal is grown on the upper wall inside the pressure vessel.

7. The method according to claim 1; wherein the $BaPb_{1-x}Bi_xO_3$ single crystal is grown as a thin film on a substrate.

8. The method according to claim 7; wherein the substrate is composed of a $SrTiO_3$ single crystal.

9. The method according to claim 1; wherein the aqueous solution contains nitrate and peroxide.

10. The method according to claim 1; wherein the aqueous solution contains $KNO_3$ and $KClO_3$.

11. The method according to claim 1; wherein the aqueous solution contains $NaNO_3$ and $NaClO_3$.

12. The method according to claim 1; wherein the aqueous solution contains $NaNO_3$ and $NaClO_4$.

13. The method according to claim 1; including quickling cooling the BaPb$_{1-x}$Bi$_x$O$_3$ single crystal after the hydrothermal synthesis.

14. A method of manufacturing BaPb$_{1-x}$Bi$_x$O$_3$ single crystal comprising: providing a starting material comprised of BaCO$_3$, PbO$_2$ and Bi$_2$O$_3$ mixed together in the desired proportions; preparing a nutrient composed of BaPb$_{1-x}$Bi$_x$O$_3$ polycrystalline from the starting material; and hydrothermally synthesizing the nutrient within a nitrate aqueous solution at a temperature and pressure effective to effect the growth of BaPb$_{1-x}$Bi$_x$O$_3$ single crystal.

15. The method according to claim 14; wherein said nitrate comprises LiNO$_3$, KNO$_3$ or NaNO$_3$.

16. The method according to claim 14; wherein the nitrate aqueous solution contains a peroxide.

17. The method according to claim 14; wherein said hydrothermal synthesis is carried out in a pressure vessel, the pressure vessel maintaining a temperature gradient between the bottom and upper portion thereof.

18. A method of manufacturing BaPb$_{1-x}$Bi$_x$O$_3$ single crystal comprising: providing a nutrient composed of BaPb$_{1-x}$Bi$_x$O$_3$ polycrystalline; and hydrothermally synthesizing the nutrient within a nitrate aqueous solution at a pressure and a nutrient temperature above 350° C. to establish a temperature gradient within the nitrate aqueous solution effective to promote the growth of BaPb$_{1-x}$Bi$_x$O$_3$ single crystal.

19. The method according to claim 18; wherein the BaPb$_{1-x}$Bi$_x$O$_3$ single crystal is grown as a thin film on a substrate.

20. The method according to claim 19; wherein said substrate is maintained about 40° C. lower than the nutrient, whereby said single crystal is grown on the substrate.

21. The method according to claim 18; including quickly cooling the BaPb$_{1-x}$Bi$_x$O$_3$ single crystal after the hydrothermal synthesis.

22. The method according to claim 18; wherein the nitrate aqueous solution contains a peroxide.

23. The method according to claim 14; wherein the hydrothermal synthesis is carried out at a temperature above 350° C.

* * * * *